United States Patent [19]

Chethik

[11] Patent Number: 6,002,723
[45] Date of Patent: Dec. 14, 1999

[54] DIGITAL RECEIVER HAVING PROGRAMMABLE COMPLEX THRESHOLD DETECTORS AND THRESHOLD INTERPRETERS

[75] Inventor: Frank Chethik, Palo Alto, Calif.

[73] Assignee: Lockheed Martin Corporation, Bethesda, Md.

[21] Appl. No.: 08/911,643

[22] Filed: Aug. 15, 1997

[51] Int. Cl.[6] .............................. H04L 25/06; H04L 25/10
[52] U.S. Cl. ........................ 375/317; 375/340; 375/345
[58] Field of Search ............................... 375/317, 316, 375/340, 345; 455/219, 232.1, 250.1

[56] References Cited

U.S. PATENT DOCUMENTS

| 5,274,674 | 12/1993 | Lafon ............................................ 375/76 |
| 5,438,593 | 8/1995 | Karam et al. .................................. 375/317 |
| 5,768,306 | 6/1998 | Sawahashi et al. ............................ 375/206 |

Primary Examiner—Stephen Chin
Assistant Examiner—Mohammad Ghayour
Attorney, Agent, or Firm—Kenneth W. Float

[57] ABSTRACT

A programmable digital baseband receiver that processes a large number of signal waveforms and data rates. Programmable elements of the receiver implement coherent signal detection, automatic gain control and decision processing that permits processing of a large number of signal bandwidth efficient QAM and similar signal formats. The receiver comprises a threshold array having a plurality of programmable complex threshold detectors, and selectable decoder tree logic structures embodied in threshold interpreters. Each programmable complex threshold detector is a fully programmable I, Q threshold detector employing programmable I, Q sign threshold detectors that is adapted to the received complex baseband signal constellation.

8 Claims, 5 Drawing Sheets

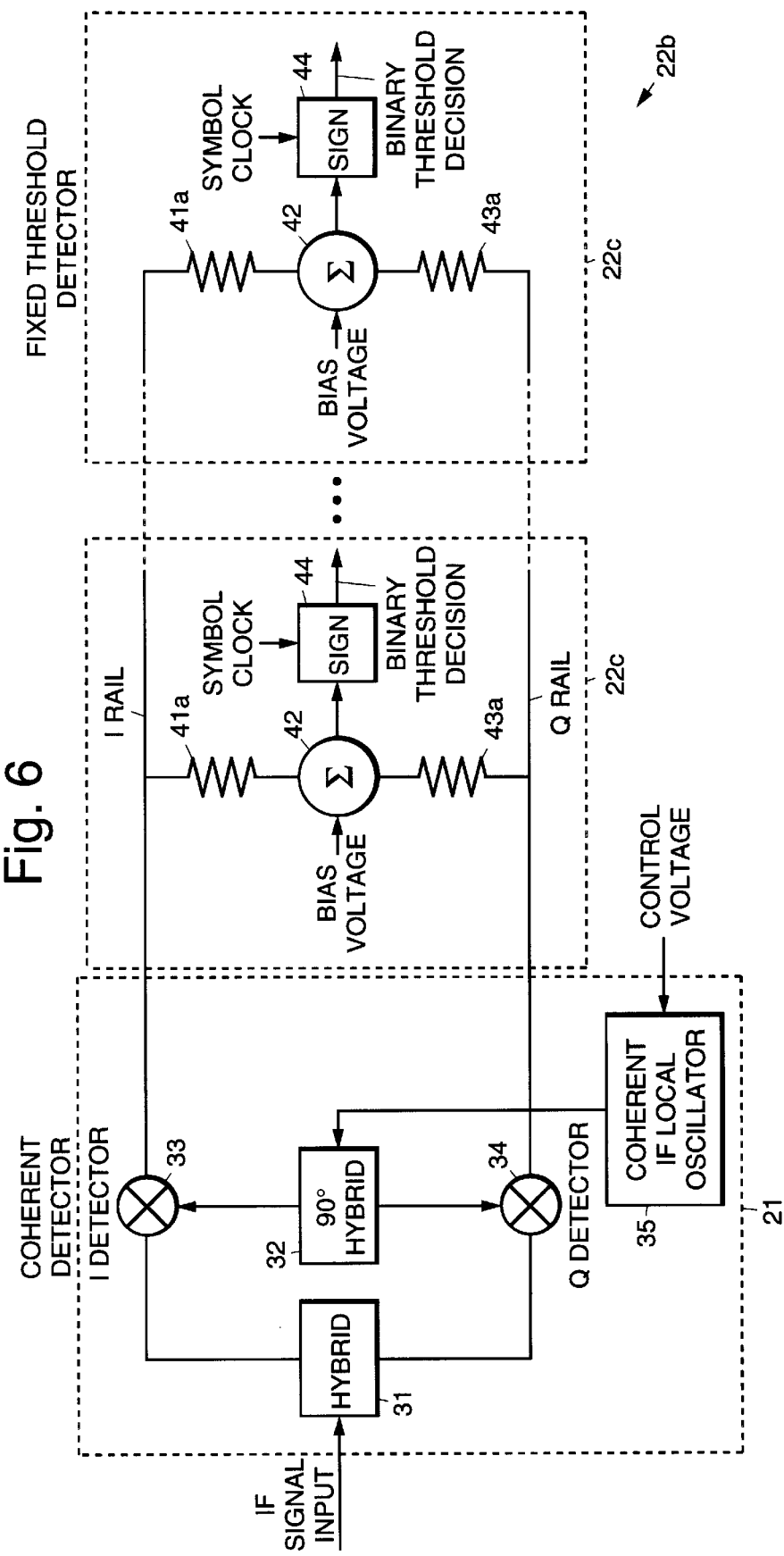

DIGITAL RECEIVER HAVING PROGRAMMABLE COMPLEX THRESHOLD DETECTORS AND THRESHOLD INTERPRETERS

BACKGROUND

The present invention relates generally to digital receivers, and more particularly, to programmable digital baseband receivers employing programmable complex threshold detectors and threshold interpreters.

A traditional DSP digital receiver employed to process multiple waveforms typically uses detection methods including sampling, A/D conversion and digital signal processing. The traditional receiver typically includes a low noise amplifier followed by an intermediate frequency (IF) downconverter that is fed by a local oscillator. The IF signal output of the downconverter feeds an AGC amplifier whose output is bandpass filtered. In a DSP receiver, the IF signal is fed to a digital signal processor.

The digital signal processor (DSP) processes the output of the bandpass filter and includes an IF to complex baseband converter, and a complex analog-to digital (A/D) converter. For digital communications, the signal is fed to a baseband equalizer, a symbol decision circuit, and a symbol decoder. For symbol rate processing, a symbol synchronization circuit is coupled to the complex A/D, baseband equalizer, symbol decision circuit, and symbol decoder to synchronize the sequential processing of symbols by these circuits. The traditional DSP, digital signal receiver is thus implemented using programmable and selectable baseband threshold elements and simple logic trees.

The waveform specifications that determine the details of the DSP-specific processes performed in the traditional DSP digital receiver must be programmed and downloaded into the DSP and other receiver elements. Implementing such a DSP receiver at variable data rates up to 10 Gbps is an expensive and complex process, and requires prime power on the order of several hundreds of Watts.

In view of the above, it is advantageous to have a digital receiver that consumes less power than conventional designs and that is programmable to accommodate a large variety of signal waveforms and data rates. It is therefore an objective of the present invention to provide for programmable digital baseband receivers employing programmable complex threshold detectors and threshold interpreters that implement coherent signal detection, automatic gain control and symbol decision processing to permit processing of a large number of bandwidth efficient QAM signal formats, and the like.

SUMMARY OF THE INVENTION

To meet the above and other objectives, the present invention provides for a digitally programmable threshold receiver that accommodates a large number of signal waveforms and data rates. Programmable elements of the receiver facilitate coherent signal detection, automatic gain control and symbol decision processing that enables processing of a large variety of signal bandwidth-efficient QAM and similar signal formats.

The programmable threshold receiver has a different topology or architecture compared to the traditional DSP digital receiver discussed in the Background section, and implements its subsystems in a very different manner. The architecture of the present programmable threshold receiver avoids dissipative A/D converters and other high speed (and power) DSP elements, such as "butterfly" multipliers.

The programmable receiver baseband processor or programmable threshold receiver is comprised of an array of programmable complex threshold detectors and selectable decoder tree logic structures embodied in threshold interpreters, to accommodate a large variety of waveforms over a large range of symbol and data rates.

Each programmable complex threshold detector is a fully programmable I, Q threshold detector that is adapted to the received complex base band signal constellation. Each programmable complex threshold detector is an inherently low power circuit because it performs relatively few threshold comparisons compared to a full multi-gigasample per second 8 bit analog-to-digital converter, for example. The programmable complex threshold detector array has an ensemble of programmable complex (I, Q) threshold detectors that are easily adapted for any of a very large set of signal constellations.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 6 illustrates a fixed threshold detector array for use in a low cost programmable digital baseband receiver in accordance with the principles of the present invention.

DETAILED DESCRIPTION

Figure 1:
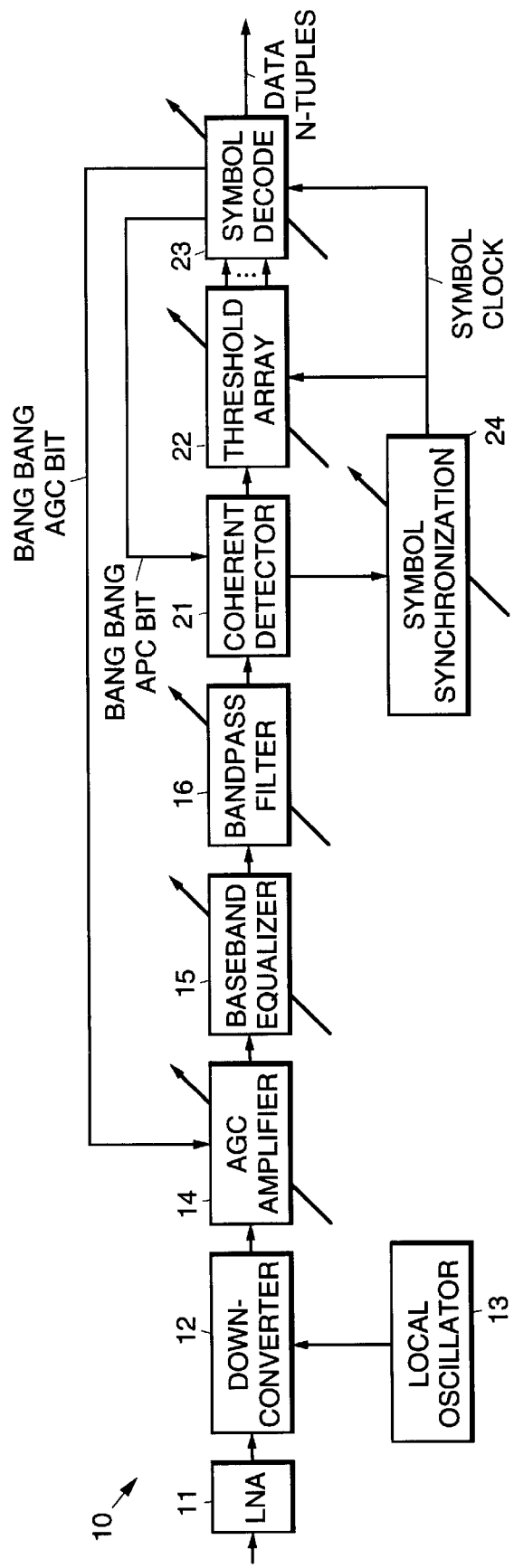
FIG. 1 illustrates the architecture of a programmable digital baseband receiver in accordance with the principles of the present invention.

Referring to the drawing figures, FIG. 1 illustrates the architecture of a programmable digital baseband receiver 10 in accordance with the principles of the present invention. The programmable digital baseband receiver 10 comprises a programmable threshold receiver 10 that is designed to process a large variety of waveforms and data rates. Circuits making up the programmable threshold receiver 10 provide for coherent signal detection, automatic gain control and symbol decision processing for a large variety of bandwidth-efficient modulation formats, such as quadrature amplitude modulation (QAM) and similar formats.

The programmable digital baseband receiver 10, or programmable threshold receiver 10, has a different topology than that of the traditional DSP digital receiver discussed in the Background section, and implements its circuits in a very different manner. The traditional DSP digital receiver employs high speed A/D converters and high speed processors. In contrast, the architecture of the programmable threshold receiver 10 employs programmable and selectable baseband threshold elements and simple logic trees and avoids the use of dissipative A/D converters and high speed (and power) DSP elements.

Referring to FIG. 1, the programmable digital baseband receiver 10 comprises a low noise amplifier (LNA) 11 that receives a radar-frequency input signal. The low noise amplifier 11 is coupled to a downconverter 12 having a reference input signal supplied thereto from a local oscillator 13. The downconverter outputs an intermediate frequency (IF) signal to a bandpass filter 16. In contrast to the conventional DSP digital receiver, the remainder of the circuits employed in the programmable digital baseband receiver 10 are adaptively controllable, which permits their reconfiguration to support processing of a variety of bandwidth-efficient modulated signals. These adaptive circuits will now be discussed.

The output of the downconverter 12 is coupled to an adaptive automatic gain control (AGC) amplifier 14, whose gain is adjusted to normalize the signal amplitude of the signal processed by the receiver 10. A baseband equalizer 15 follows the AGC amplifier 14 and is adjusted for the particular data rate of the modulated signals that are processed and corrects for distortions of the signal channel. The bandpass filter 16 follows the baseband equalizer 15 that is selected for the symbol rate of the signals that are processed.

A coherent detector 21 is coupled to the output of the adaptive bandpass filter 16 that processes the downconverted and equalized modulated signals to output a complex baseband signal constellation. The heart of the present invention resides in an adaptive coherent threshold detector array 22 and an adaptive symbol decode circuit 23 comprising a threshold interpreter 23 that follow the coherent detector 21. An automatic gain control (AGC) feedback path is provided between the symbol decode circuit 23 and the adaptive AGC amplifier 14. An automatic phase control (APC) feedback path is provided between the symbol decode circuit 23 and the coherent detector 21.

An adaptive symbol synchronization circuit 24 is coupled to the coherent detector 21, and receives a complex envelope waveform, extracts the symbol frequency spectral line and creates a synchronous symbol clock signal. The adaptive symbol synchronization circuit 24 is coupled to the adaptive threshold detector array 22 and the adaptive symbol decode circuit 23 and outputs symbol clock signals thereto that synchronize processing of the signal constellation though these circuits. The symbol synchronization circuit 24 is adjusted for the symbol rate of the received signals.

Figure 2:
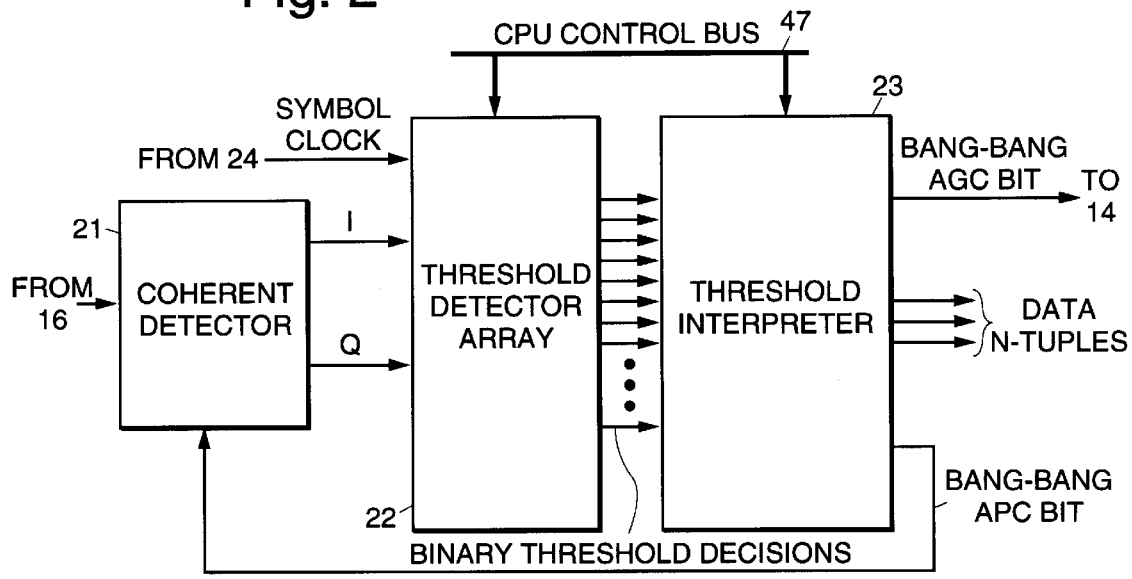
FIG. 2 illustrates the primary processing circuits of the receiver of FIG. 1 and shows the decoded outputs of threshold interpreter logic employed therein.

FIG. 2 illustrates the primary processing circuits of the receiver 10 of FIG. 1 and shows the decoded outputs of the threshold interpreter 23 employed therein. As is shown in FIG. 2, I and Q outputs of the coherent detector 21 are coupled to the threshold detector array 22. Outputs of the threshold detector array 22 comprise sample decisions that are input to the threshold interpreter 23. The threshold interpreter 23 outputs a bang-bang AGC bit that, after suitable filtering, is fed back to the AGC amplifier 14 to adaptively adjust its gain for the data rate and signal level of the processed signals. The threshold interpreter 23 also outputs a bang-bang APC bit that, after suitable phase lock loop filtering, is fed back to control the phase of the coherent IF local oscillator signal injected into the coherent detector. The threshold interpreter 23 outputs data N-tuples contained in the received modulated waveform. A CPU control bus 47 selects the coefficients of the threshold detector array 22 and controls the logic configuration of the threshold interpreter 23.

Figure 3:
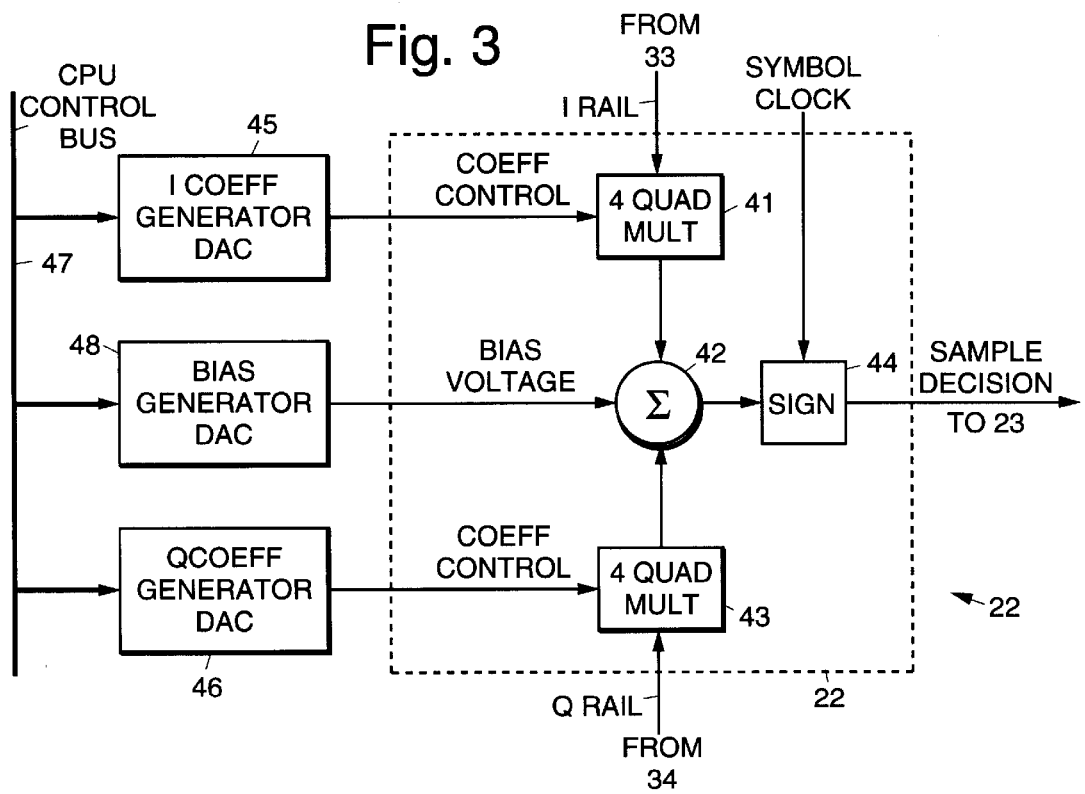
FIG. 3 illustrates details of a programmable complex threshold detector employed in the threshold detector array of FIGS. 1 and 2.

FIG. 3 illustrates details of a programmable complex threshold detector 22a employed in the threshold detector array 22 of FIGS. 1 and 2. The programmable threshold detector 22a comprises I and Q analog four quadrant multipliers ($k_I$, $k_Q$) 41, 43 whose multiplier coefficients are driven by a low speed digital-to-analog converters (DACs) 45, 46. Analog multipliers are given by example but digital multipliers with D/A conversion of the products may be used without loss of applicability of the present invention. The digital-to-analog converters 45, 46 are driven by way of the CPU control bus 47. The I and Q four quadrant multipliers 41, 43 are driven by the complex baseband the I and Q signals derived from the detectors 33, 34 (by way of I and Q rails). An offset bias voltage is generated from a bias generator DAC 48 and is also driven by way of the CPU controller data bus 47.

Outputs of the I and Q four quadrant multipliers 41, 43 are coupled to first and second inputs of a three input summing device 42 that has the controlled bias voltage coupled to its third input. The output of the summing device 42 is coupled to a sign threshold detector 44 that receives the symbol clock signal from the adaptive symbol synchronization circuit 24. The sign threshold detector 44 outputs a sample decision that is input to the threshold interpreter 23. As will be explained in more detail below, there may be as many as 32 complex threshold detectors 22a that form a typical programmable complex threshold detector array 22. The number of detectors 22a and their programming (bias and coefficient settings) are determined based upon the particular waveform that is to be processed by the receiver 10.

Figure 4:
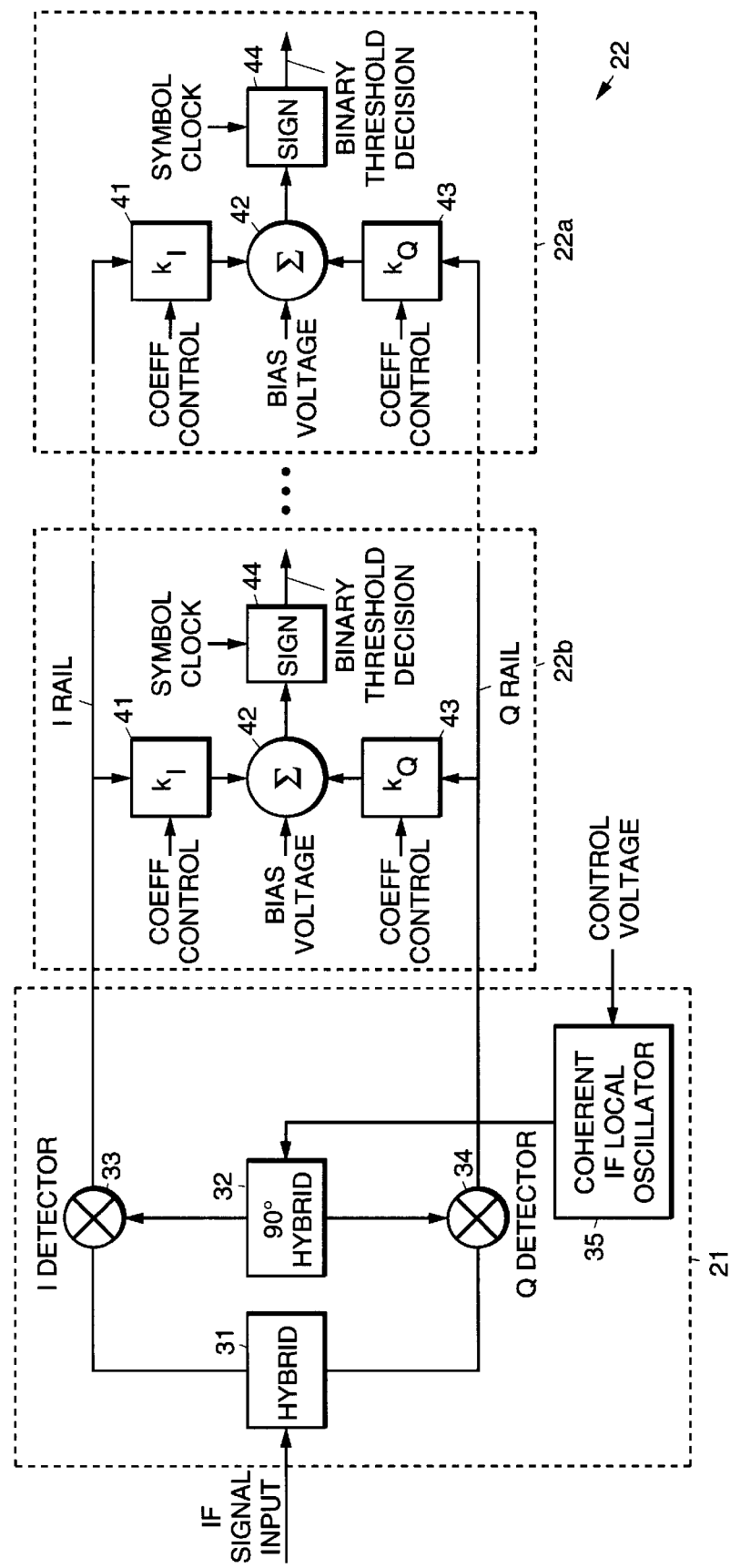
FIG. 4 illustrates details of the coherent detector and threshold detector array of the receiver of FIG. 1.

FIG. 4 illustrates details of the coherent detector 21 and the threshold detector array 22 employed in the receiver 10. The coherent detector 21 comprises a hybrid coupler 31 that splits the downconverted intermediate (IF) signal output by the bandpass filter 16 to the inputs of I and Q detectors 33, 34, respectively. A 90 degree hybrid coupler 32 driven by a coherent IF local oscillator 35 couples a quadrature pair of local oscillator (reference) signals to second inputs of the respective I and Q detectors 33, 34. Outputs of the respective I and Q detectors 33, 34 are coupled to each programmable threshold detector 22a that is employed in the programmable threshold detector array 22. Each programmable threshold detector 22a is configured as disclosed with reference to FIG. 3. The CPU control bus-derived multiplier coefficients are supplied to the I and Q four quadrant multipliers 41, 43. The CPU control bus 47 also selects the decoding logic employed in the threshold interpreter 23.

FIGS. 5a–5d illustrate a variety of example constellations that may be processed by the receiver 10 of FIG. 1. The logic that decodes each of the example constellations is contained in the threshold interpreter 23, which decodes the binary threshold decisions output by the plurality of programmable threshold detector 22a that form the programmable threshold detector array 22. This will be explained in more detail below.

Each programmable complex threshold detector 22a is a fully programmable I, Q threshold detector 22a that is adapted to the received complex baseband signal constellation. It is an inherently low power circuit because it performs relatively few threshold comparisons compared to a full multi-gigasample per second 8 bit analog-to-digital converter complex (I, Q) pair. The programmable complex threshold detector array 22 has an ensemble of programmable IQ sign threshold detectors 22a that are easily adapted for any of a very large set of signal constellation, such as the constellation examples shown in FIGS. 5a–5d.

Figure 5A:
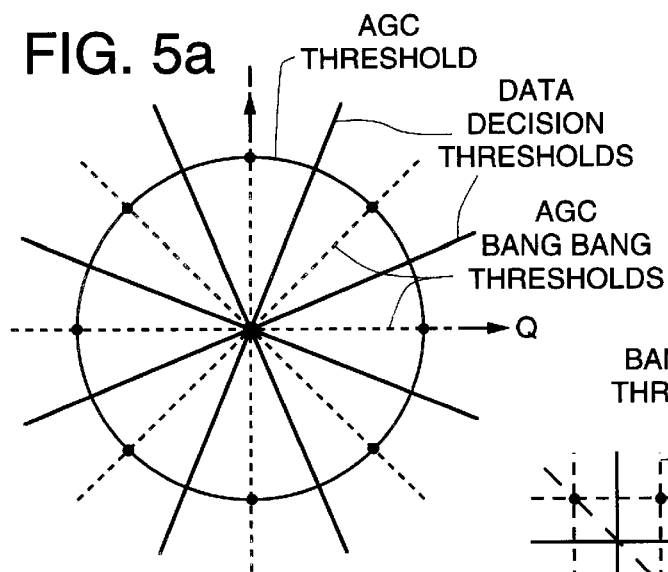
FIGS. 5a–5d illustrate a variety of example constellations that may be processed using the receiver of FIG. 1.

FIG. 5a shows an 8 PSK constellation. The solid lines in FIG. 5a represent data decision thresholds while the dashed lines represent automatic phase control (APC) bang-bang phase look loop thresholds.

Figure 5C:
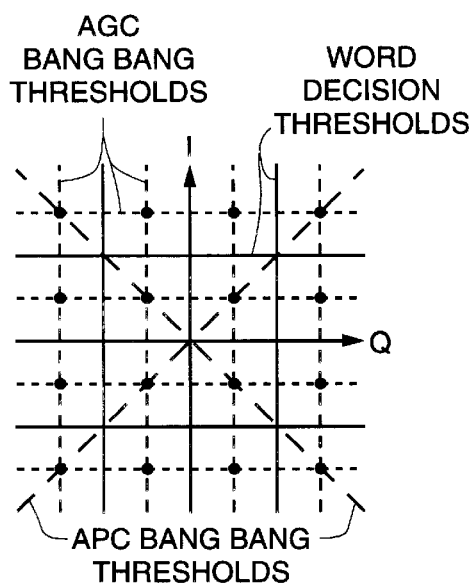
Figure 5B:
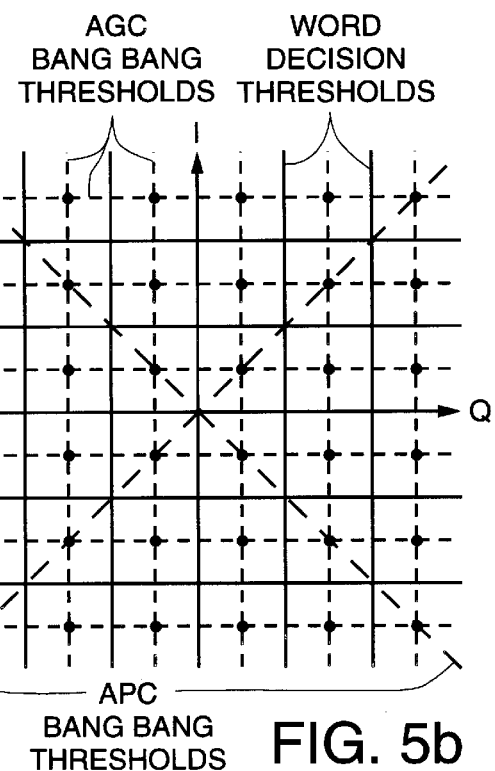

FIG. 5b shows a "32 cross" constellation capable of transmitting 5 bits per symbol. The solid lines in FIG. 2b represent data decision thresholds, the thick dashed lines represent automatic phase control (APC) bang band thresholds, and the thin dashed lines represent automatic gain control (AGC) thresholds. In this case, the threshold interpreter must output 7 bits, a 5-tuple symbol, one APC bit and one AGC bit.

FIG. 5c shows a 16 point quadrature amplitude modulation (QAM) constellation. The solid lines in FIG. 5c represent word decision thresholds, the thick dashed lines represent automatic phase control (APC) bang-bang thresholds, and the thin dashed lines represent automatic gain control (AGC) thresholds.

Figure 5D:
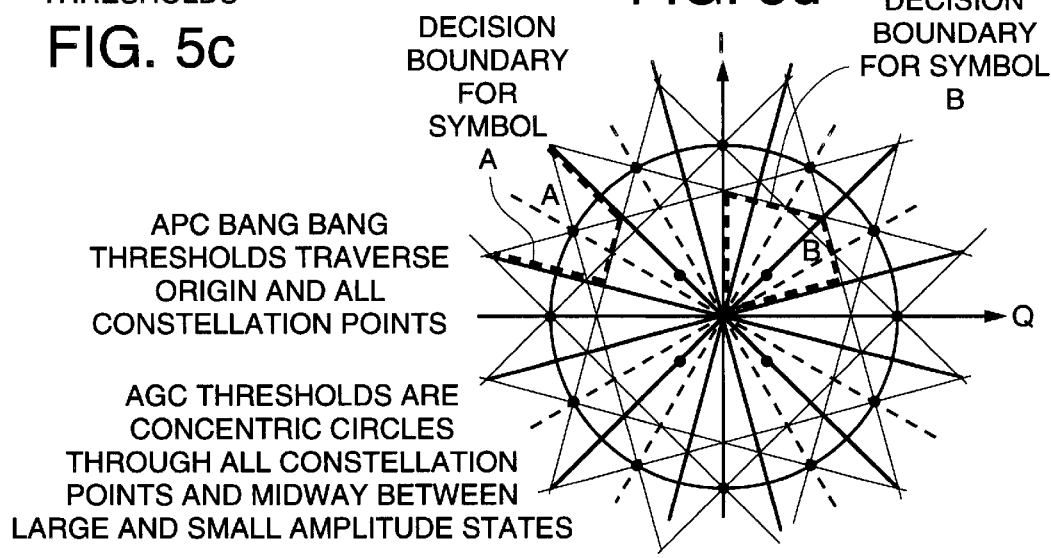

FIG. 5d shows a 12, 4 amplitude-phase keyed (APK) constellation. The dots illustrate states of the 12, 4 APK symbol constellation. The heavy lines are the symbol decision boundaries that are decoded in the symbol decode logic contained in the threshold interpreter 23.

The solid lines in 5a–5d define boundaries of symbol decision regions for making symbol decisions. The dashed and dotted lines are boundaries for phase error decisions and gain error decisions, respectively. These decision thresholds are created by means of the selected plurality of programmable threshold detectors 22a. The phase angle of the threshold with respect to the I and Q axis is determined by the ratio of the multiplier coefficients $K_I$ and $K_Q$. The threshold offset from the I, Q origin is determined by the applied bias voltage. Thus for any desired constellation, an array of threshold detectors 22a is programmed with an appropriate waveform-unique array of multiplier coefficients and bias voltages to form the required ensemble of decision thresholds. As many as 32 of these decision thresholds may be needed for waveforms exhibiting many bits per symbol, although fewer are required for simpler waveforms.

The binary decisions that result from the processing by the threshold detectors 22a are then logically combined in the threshold interpreter 23 to generate symbol decisions, phase and gain control data. The threshold interpreter 23 for any particular constellation is a particular logic tree structure that correctly interprets the binary decisions of the programmable threshold detector array 22.

By example, the threshold interpreter 23 may be comprised of a switch selectable array of waveform-specific logic trees, where each logic tree is comprised of several gates. By processing the binary decisions output by the programmable coherent threshold detector array 22 using the logic in the threshold interpreter 23, the threshold interpreter 23 translates threshold data into data decision regions (received data n-tuples) and phase (APC) and gain (AGC) servo loop control bits. Although this digital assembly is less waveform flexible than a full A/D converter and digital symbol recovery lookup table system, for example, it uses far less power. The switch selected threshold interpreter logic tree employed in the in the threshold interpreter 23 may be configured so that power is applied only to the selected tree and thus unused portions of the threshold interpreter 23 do not consume power or dissipate heat.

The programmable coherent threshold detector array 22 includes wideband analog processes implemented using multipliers 41, 43, summers 42 and threshold comparators 44, low bandwidth analog processes implemented using bias voltages and analog multiplier coefficients, and low speed digital processes implemented using the CPU control bus 47, address decoding and coefficient and bias word buffering (in the CPU bus interface circuits) and low rate digital to analog conversion (DACs 45, 46, 48). It is logical to segregate the high speed from low speed functions of the programmable coherent threshold detector array 22. Several wideband elements of the programmable coherent threshold detector array 22 comprising the four-quadrant multipliers 41, 43, summers 42 and threshold comparators 44 may be aggregated on a single integrated circuit chip. As many as 4 to 8 of these circuits may by disposed on a single Gallium Arsenide (GaAs) or other suitable semiconductor material chip. The other low speed digital and analog circuits may be aggregated on a second silicon custom ASIC chip, for example.

The number of thresholds required to demodulate a large set of transmission waveforms is shown in Table 1

TABLE 1

| Constellation | Number of Data Decision Thresholds | Number of AGC & APC Thresholds | Total Number of Thresholds |
| --- | --- | --- | --- |
| OPSK | 2 | 6 | 8 |
| 8PSK | 4 | 4 & Envelope Det. | 8 |
| 16 QAM | 6 | 10 | 16 |
| 12, 4 APK | 16 | 4 & Envelope Det. | 20 |
| 32 Cross | 10 | 14 | 24 |
| 64 QAM | 14 | 18 | 32 |

Given a requirement to process 64 QAM, the number of required thresholds is 32. Four thresholds may be implemented per GaAs MMIC chip requiring 8 chips to form the programmable coherent threshold detector array 22. Conservatively, each chip dissipates 4 Watts or less, yielding a power consumption of 32 Watts for the programmable coherent threshold detector array 22. The threshold interpreter 23 is estimated to consume less than 5 Watts, and a low rate digital and analog processor silicon ASIC is estimated to consume less than 2 Watts. The entire baseband receiver 10 will consume less than 40 Watts to process a 64 QAM, 2.5 Gsps signal. A traditional DSP approach requiring analog to digital converters and look-up table symbol recovery elements would require several 100's of Watts; to process this signal.

For less complex waveforms, only those devices needed to implement the required number of thresholds are required. The threshold detector array 22 for a 16 QAM signal consumes only about 20 Watts of power. It is estimated that the remainder of RF and baseband processor elements consume 25 Watts of power or less, which assumes about 10 Watts for an adaptive passband transversal baseband equalizer 16. Thus the entire 64 QAM receiver 10 therefore requires no more than about 60 Watts of regulated power.

A basic structure of the programmable coherent threshold detector array 22 and threshold interpreter 23 may be implemented in low cost but non-programmable (fixed waveform) configuration. FIG. 6 illustrates a fixed threshold detector array 22b for use in a low cost programmable digital baseband receiver 10 in accordance with the principles of the present invention.

For a known constellation, the fixed threshold detector array 22b and a fixed threshold interpreter 23 may be employed that respectively use fixed I and Q multiplier coefficients and a fixed logic tree. Referring to FIG. 6, the multiplier coefficients may be realized as resistors 41a, 43a that couple each fixed threshold detector 22c to the I and Q signal inputs. This set of fixed thresholds are then coupled to a fixed threshold interpreter 23 (fixed decoding tree) that cooperate to generate symbol decisions, APC control decisions, and AGC control decisions, for a particular constellation in the manner described above.

A fixed threshold array 22b together with its associated threshold interpreter logic tree may be packaged as a waveform-specific assembly (card). The digital receiver 10 may be equipped with a variety of fixed threshold detector arrays 22b and cards containing threshold interpreters 23, and the appropriate card may be switch selected for the anticipated waveform. A small number of these cards can facilitate the reception of several waveforms for a given system application. For a fixed application where only a single signal format is used, only that card is required in the receiver 10.

Thus, programmable digital baseband receivers employing programmable complex threshold detectors and threshold interpreters that implement coherent signal detection, automatic gain control and decision processing to permit processing of a large number of signal-bandwidth efficient QAM signal formats, and the like, have been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A programmable digital baseband receiver comprising:
    a coherent detector for processing downconverted and equalized modulated signals to output a complex baseband signal constellation comprising I and Q signals;
    an adaptive coherent threshold detector array coupled to the coherent detector for processing the I and Q signals of the complex baseband signal, constellation and for comparing the I and Q signals to predetermined thresholds to generate binary decisions that are indicative of data decision regions; and
    a threshold interpreter coupled to the adaptive coherent threshold detector array for generating phase and gain control signals.

2. The receiver of claim 1 wherein the adaptive threshold detector array comprises a plurality of programmable complex threshold detectors that each comprise:
    I and Q coefficient digital-to-analog converters respectively coupled between the symbol synchronization circuit for outputting I and Q coefficients;
    a bias generator digital-to-analog converter coupled to the symbol synchronization circuit for outputting a bias voltage;
    I and Q four quadrant multipliers respectively coupled to the I and Q detectors for receiving the I and Q signals and coupled to the I and Q coefficient digital-to-analog converters for receiving the I and Q coefficients;
    a summing device coupled to the multipliers and the bias generator digital-to-analog converter for receiving the outputs of the I and Q multipliers and the bias voltage, and for generating a summation of the analog baseband signals; and
    a sign threshold detector coupled to the summing device and to the symbol synchronization circuit for receiving the symbol clock signal and summation of the analog baseband signals, and that outputs a sample binary signal that indicates the sign of the summation signal at the sample clock instant that is input to the threshold interpreter.

3. The receiver of claim 1 wherein a programmable complex threshold detector determines sign decision thresholds by using multiplier coefficients, and applied offset bias voltage, and wherein, for any desired constellation, an array of threshold detectors is programmed with appropriate multiplier coefficients and bias voltages to form the required decision thresholds.

4. The receiver of claim 1 wherein the threshold interpreter comprises a programmable array of waveform-specific logic, wherein each logic configuration is unique to the desired waveform.

5. The receiver of claim 1 wherein the threshold interpreter processes the binary decisions output by the programmable coherent threshold detector array to translate threshold data into symbol (n-tuple) decision regions and phase (APC) and gain (AGC) control bits.

6. The receiver of claim 1 wherein the threshold interpreter logically combines the binary decisions generated by the threshold detectors to generate symbol decisions and phase and gain control data.

7. The receiver of claim 1 wherein the programmable complex threshold detector comprises:
    a fixed threshold detector array having fixed I and Q multiplier coefficients; and
    a fixed threshold interpreter having a fixed logic tree.

8. The receiver of claim 6 wherein the fixed threshold detector array comprises resistors that implement the fixed multiplier coefficients.

* * * * *